United States Patent
Zhu et al.

(10) Patent No.: US 8,823,013 B2
(45) Date of Patent: Sep. 2, 2014

(54) SECOND SCHOTTKY CONTACT METAL LAYER TO IMPROVE GAN SCHOTTKY DIODE PERFORMANCE

(71) Applicant: Power Integrations, Inc., San Jose, CA (US)

(72) Inventors: Ting Gang Zhu, Somerset, NJ (US); Marek Pabisz, Quakertown, PA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 14/105,057

(22) Filed: Dec. 12, 2013

(65) Prior Publication Data

US 2014/0110721 A1   Apr. 24, 2014

Related U.S. Application Data

(63) Continuation of application No. 13/200,206, filed on Sep. 21, 2011, now Pat. No. 8,629,525, which is a continuation of application No. 11/589,124, filed on Oct. 27, 2006, now Pat. No. 8,026,568.

(60) Provisional application No. 60/736,893, filed on Nov. 15, 2005.

(51) Int. Cl.
| | |
|---|---|
| *H01L 29/872* | (2006.01) |
| *H01L 29/778* | (2006.01) |
| *H01L 29/47* | (2006.01) |
| *H01L 21/285* | (2006.01) |
| *H01L 29/66* | (2006.01) |
| *H01L 29/20* | (2006.01) |

(52) U.S. Cl.
CPC .......... *H01L 29/7786* (2013.01); *H01L 29/872* (2013.01); *H01L 29/2003* (2013.01); *H01L 29/475* (2013.01); *H01L 21/28581* (2013.01); *H01L 29/66143* (2013.01); *H01L 29/47* (2013.01); *H01L 29/7787* (2013.01)
USPC ...... 257/76; 257/195; 257/471; 257/E21.173; 257/E21.359; 257/E29.089

(58) Field of Classification Search
CPC .............. H01L 29/475; H01L 29/7786; H01L 29/7787; H01L 29/66143; H01L 29/47
See application file for complete search history.

(56) References Cited

U.S. PATENT DOCUMENTS

| | | | |
|---|---|---|---|
| 2003/0015708 A1* | 1/2003 | Parikh et al. | 257/73 |
| 2005/0151255 A1* | 7/2005 | Ando et al. | 257/750 |
| 2005/0194610 A1* | 9/2005 | Souma et al. | 257/133 |
| 2008/0135880 A1* | 6/2008 | Yoshida et al. | 257/194 |

* cited by examiner

*Primary Examiner* — Minh-Loan T Tran
*Assistant Examiner* — Fazli Erdem
(74) *Attorney, Agent, or Firm* — The Law Offices of Bradley J. Bereznak

(57) ABSTRACT

A Schottky contact is disposed atop the surface of the semiconductor. A first Schottky contact metal layer is disposed atop a first portion of the semiconductor surface. A second Schottky contact metal is disposed atop a second portion of the surface layer and joins the first Schottky contact metal layer. A first. Schottky contact metal layer has a lower work function than the second Schottky contact metal layer.

6 Claims, 5 Drawing Sheets

SECOND SCHOTTKY CONTACT METAL LAYER TO IMPROVE GAN SCHOTTKY DIODE PERFORMANCE

CROSS REFERENCE TO RELATED APPLICATIONS

This application is a continuation of application Ser. No. 13/200,206 filed Sep. 21, 2011, which is a continuation of application Ser. No. 11/589,124 filed Oct. 27, 2006, now U.S. Pat. No. 8,026,568, which claims the priority of U.S. Provisional Application No. 60/736,893, filed Nov. 15, 2005, the disclosure of which is incorporated by reference herein, each of which is assigned to the assignee of the present application.

BACKGROUND OF THE INVENTION

The invention is directed to Schottky diodes as well as to other devices having a Schottky contact and, more particularly, to the Schottky contact metals used in such devices.

Two important properties of a Schottky diode are its forward voltage drop, $V_F$, and its reverse blocking voltage $V_R$. The metal that forms the Schottky contact in the Schottky diode greatly impacts the two parameters. For high blocking voltage applications, the Schottky diode requires a Schottky contact metal having a high work function to provide a large barrier height at the metal-to-semiconductor interface. However, the large barrier height also causes a higher voltage drop when the diode is forward biased. Another concern is that when the diode is reverse biased, the highest electric fields occur at the edge of the metal contact, whereas when the diode is forward biased, all of the contact area conducts the current uniformly.

Known solutions for improving the reverse biased characteristics of GaN Schottky devices also sacrifice the forward bias performance of the device, such as by increasing the forward voltage drop. It is therefore desirable to improve the reverse biased characteristics of such devices without degrading the forward voltage drop.

SUMMARY OF THE INVENTION

According to an aspect of the invention, a Schottky contact is disposed atop the surface of the semiconductor. A first Schottky contact metal is disposed atop of the first portion of the semiconductor surface, A second Schottky contact metal layer is disposed atop of a second portion of the semiconductor surface and at least adjoins the first Schottky contact metal layer. The first Schottky contact metal layer has a lower work function than that of the second Schottky metal contact layer.

In accordance with this aspect of the invention, a Schottky diode includes a lower layer of nitride semiconductor disposed atop a substrate. An upper layer of nitride semiconductor is disposed atop at least a portion of the lower layer of nitride semiconductor. The lower layer of nitride semiconductor is more highly doped than the upper layer of nitride semiconductor. A Schottky contact is disposed atop the upper layer of semiconductor in the manner described above. The semiconductor surface being a surface of upper layer of nitride semiconductor. A further metal contact layer is disposed atop the lower layer of nitride semiconductor such that an ohmic contact is formed.

Also according to this aspect of the invention, a field effect transistor (FET) includes a lower layer of nitride semiconductor is disposed atop a substrate. An upper layer of nitride semiconductor is disposed atop at least a portion of the lower layer of nitride semiconductor. The upper layer is a different nitride semiconductor than the lower layer so that a heterojunction is formed between the layers. A Schottky contact is disposed atop the upper layer of nitride semiconductor in the manner described above. The semiconductor surface is a surface of the upper layer of nitride semiconductor. A further metal contact layer is disposed atop the lower layer of nitride semiconductor such that an ohmic contact is formed.

A further aspect of the invention is a method of forming a Schottky contact atop a surface of a semiconductor. A first Schottky contact metal layer is formed atop a first portion of the semiconductor surface. A second Schottky contact metal layer is formed atop of a second portion of the surface and at least adjoining the first. Schottky contact metal layer. The first Schottky contact metal layer has a lower work function than the second Schottky contact metal layer.

A method of forming a Schottky diode and a method of forming a field effect transistor (FET) are also in accordance with this aspect of the invention.

Another aspect of the invention is a method of improving metal adhesion in a Schottky contact. A first Schottky contact metal layer is formed atop at least a portion of a surface of the semiconductor structure. The first Schottky contact metal layer includes a higher work function metal. The first Schottky contact metal layer is annealed at a temperature of at least 300° C. and at most 500° C. A second Schottky contact metal layer is formed atop at least a portion of the first Schottky contact metal layer.

A method of forming a Schottky diode and method of forming a field effect transistor (FET) are carried out in accordance with this aspect of the invention.

Yet another aspect of the invention is a Schottky contact having improved metal adhesion. A first Schottky contact metal layer is disposed atop at least a portion of a surface of a semiconductor structure. The first Schottky contact metal layer includes a higher work function metal and is annealed at a temperature of at least 300° C. and at most 500° C. A second Schottky contact metal layer is disposed atop at least a portion of the first Schottky contact metal layer.

In accordance with this aspect of the invention, a Schottky diode and a field effect transistor (FET) are provided.

The foregoing aspects, features and advantages of the present invention will be further appreciated when considered with reference to the following detailed description and accompanying drawings.

DETAILED DESCRIPTION

The present invention provides a Schottky diode having two deposited Schottky contact metals to improve device performance when the device is reverse biased while maintaining substantially the same forward voltage drop values when the device is forward biased. The first Schottky contact metal has relatively small metal work function whereas the second Schottky contact metal has relatively high metal work function. When the device is forward biased, most of the Schottky contact has a small barrier height because of the first Schottky contact metal's reduced contact resistance which, as a result, improves current flow. When the device is reverse biased, the effect of the high work function second Schottky contact metal dominates and results in a high reverse blocking voltage $V_R$.

As used in the present disclosure, the term "III-V semiconductor" refers to a compound semiconductor material according to the stoichiometric formula $Al_aIn_bGa_cN_dAs_eP_f$ where (a+b+c) is about 1 and (d+e+f) is also about 1. The term "nitride semiconductor" or "nitride-based semiconductor" refers to a III-V semiconductor in which d is 0.5 or more, most typically about 0.8 or more. Preferably, the semiconductor materials are pure nitride semiconductors, i.e., nitride semiconductors in which d is about 1.0. The term "gallium nitride based semiconductor" as used herein refers to a nitride semiconductor including gallium, and most preferably including gallium as the principal metal present, i.e., having $c \geq 0.5$ and most preferably $\geq 0.8$. The semiconductors may have p-type or n-type conductivity, which may be imparted by conventional dopants and may also result from the inherent conductivity type of the particular semiconductor material. For example, gallium nitride-based semiconductors having defects typically are inherently n-type even when undoped. Conventional electron donor dopants such as silicon (Si), germanium (Ge), sulfur (S), and oxygen (O), can be used to impart n-type conductivity to nitride semiconductors, whereas p-type nitride semiconductors may include conventional electron acceptor dopants such as Magnesium (Mg) and Zinc (Zn).

Figure 1A:
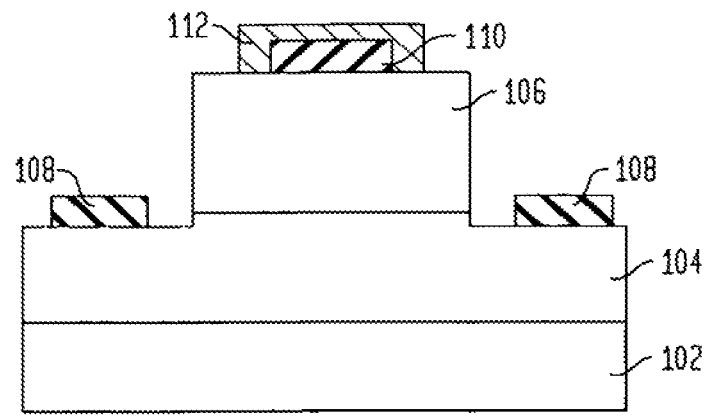
FIG. 1a shows a cross-sectional view of a Schottky diode having a dual metal Schottky contact according to an embodiment of the invention.

FIG. 1 illustrates a cross-sectional view of a nitride-based Schottky diode formed in accordance with the invention. The Schottky diode 100 includes a substrate 102 upon which further layers are grown. Ideally, the substrate should have a lattice spacing, namely the spacing between adjacent atoms in its crystal lattice, that is equal to that of the gallium nitride or other nitride-based semiconductors that are to be grown atop the substrate to reduce the number of defects, such as dislocations in the crystal lattice, that are formed in the nitride-based semiconductor. Additionally, it is also highly desirable for the substrate to have a thermal expansion coefficient at least equal that of the nitride-based semiconductor so that when the substrate and nitride-based semiconductor are cooled after the growth of the nitride-based semiconductor layer, the substrate will contract more than the semiconductor layer f thereby compressing the semiconductor layer and avoiding the formation of cracks in the layer.

The substrate 102 may be an insulating or non-conducting substrate, such as a crystalline sapphire wafer, a silicon carbide wafer or an undoped silicon wafer, that is used to form a laterally conducting device. To compensate for the lattice mismatch and the thermal expansion coefficient mismatch between the nitride-based semiconductor layer and the substrates, a buffer layer (not shown) may be provided atop the substrate 102. The buffer layer may be comprised of one or more layers of nitride-based materials to provide a transition between the lattice structure of the substrate and the lattice structure of the gallium nitride or other nitride-based semiconductor layer.

A highly doped nitride-based semiconductor layer 104, such as gallium nitride or a gallium nitride-based semiconductor, is then formed atop the buffer layer or, when the buffer layer is not present, directly atop the substrate 102. The highly doped layer 104 is typically formed using an epitaxial growth process. A reactive sputtering process may be used where the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, metal organic chemical vapor deposition (MOCVD) is employed wherein the substrate is exposed to an atmosphere containing organic compounds of the metals as well as to a reactive nitrogen-containing gas, such as ammonia, and dopant-containing gas while the substrate is maintained at an elevated temperature, typically around 700-1100° C. The gaseous compounds decompose and form a doped metal nitride semiconductor in the form of a film of crystalline material on the surface of the substrate 102. The substrate and the grown film are then cooled. As a further alternative, other epitaxial growth methods, such as molecular beam epitaxy (MBE) or atomic layer epitaxy may be used. The resulting highly doped layer 104 is preferably n-type and has a doping concentration of at least $4E18$ cm$^{-3}$.

A lower doped nitride-based semiconductor layer 106, such as gallium nitride or a gallium nitride-based semiconductor, is formed atop at least atop part of the highly doped layer 104, such as by modulation doping. An example of a lower doped nitride-based semiconductor layer formed by modulation doping is described in U.S. application Ser. No. 10/780,526, filed Feb. 17, 2004 to Pophristic et al., and titled "Low Doped Layer for Nitride-Based Semiconductor Device", the disclosure of which is incorporated herein by reference.

Typically, the lower doped layer 106 is formed atop the entire surface of the higher doped layer 104 and is then patterned and etched so that portions of the lower doped layer 106 are removed and expose regions of the higher doped layer 104. Such patterning and etching steps may be carried out in a known manner.

To maximize the reverse blocking voltage $V_R$ and minimize the forward voltage drop $V_F$ of the Schottky diode, the dual metal Schottky contact of the invention is used. A first Schottky metal layer 110 is formed atop the lower doped layer 106 in a known manner and forms the metal-to-semiconductor junction with the lower doped layer, known as a Schottky junction. The first Schottky contact metal layer 110 is formed of one or more metals relatively small metal work function, such as aluminum (Al), titanium (Ti), molybdenum (Mo), or gold (Au). Preferably, an Al contact metal layer is used to provide the lowest forward voltage drop.

A second Schottky contact metal 112 is then provided, preferably, atop of and surrounding the first Schottky contact metal 110. The second Schottky contact metal layer is formed of one or more metals having a relatively high metal work function, such as nickel (Ni), palladium (Pd), a titanium-tungsten (TiW) alloy, tantalum (Ta), rhenium (Re), ruthenium (Ru) or platinum (Pt). Preferably, a Ni contact layer is used to provide better device performance.

Figure 1B:
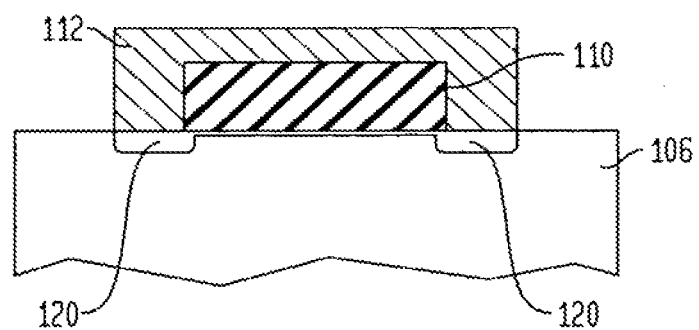
FIG. 1b is a cut-away view showing the Schottky contact of the diode of FIG. 1a and the depletion region when no bias voltage is applied.

A shallow depletion region 120 is present in the portion of the lower doped layer 106 that adjoins the dual metal Schottky contact when no bias voltage is applied to the resulting device, as FIG. 1b shows. Most of the Schottky contact has a small barrier height because the first Schottky contact metal 110 reduces the contact resistance and thus improves the current flow.

Figure 1C:
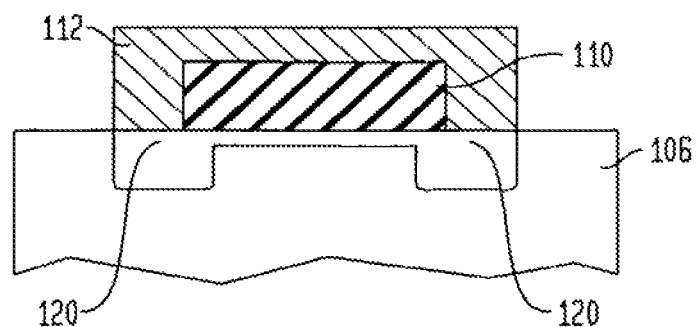
FIG. 1c is a cut-away view showing the Schottky contact of the diode of FIG. 1a and the depletion region when the device is reversed biased.

When the device is reverse biased, a deeper depletion region is formed, shown in FIG. 1c. The properties of the second Schottky contact metal 112, namely, its high work function dominates and results in a high reverse blocking voltage $V_R$.

A further metal layer 108 is disposed atop the highly doped layer 104 and forms an ohmic contact with the highly doped layer. The ohmic metal layer is typically a stack of one or more metals, such as an aluminum/titanium/platinum/gold (Al/Ti/Pt/Au) stack or a titanium/aluminum/platinum/gold (Ti/Al/Pt/Au) stack, though other metals or combinations of metals may be used. Examples of an Al/Ti/Pt/Au ohmic contact stack and its formation are described in U.S. Pat. No. 6,653,215, which is titled "Contact To n-GaN With Au Termination" and issued on Nov. 25, 2003, the disclosure of which is incorporated herein by reference.

A thicker bond pad metal layer (not shown) may be formed atop the Schottky metal layers 110, 112 and atop the ohmic metal layer 108. The bond pad metal layer is typically a thick layer of aluminum (Al) or gold (Au). A passivation layer (not shown) comprised of an insulator may be formed at least between the ohmic metal and Schottky metal layers.

The Schottky metal layers 110, 112 and the ohmic metal layer 106 may be formed using methods known in the art.

Figure 2:
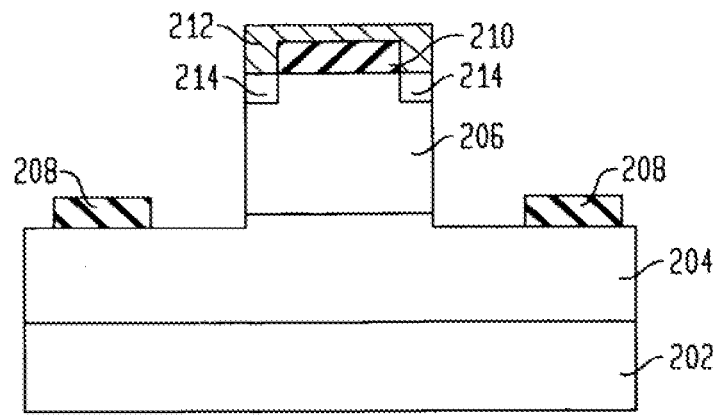
FIG. 2 shows a cross-sectional view of a Schottky diode having a dual metal Schottky contact according to another embodiment of the invention.

Another embodiment of a Schottky diode having. The dual metal Schottky contact of the invention is shown in FIG. 2. In this embodiment, a first Schottky contact metal layer 210 has a low work function and is also used as an implant mask to permit a self-aligned ion implant to be carried out prior to forming a second Schottky contact metal layer 212. The second Schottky contact metal 212 has a high work function and also serves as a mesa etch mask during a self-aligned mesa etch of lightly doped layer 206.

Figure 2A:
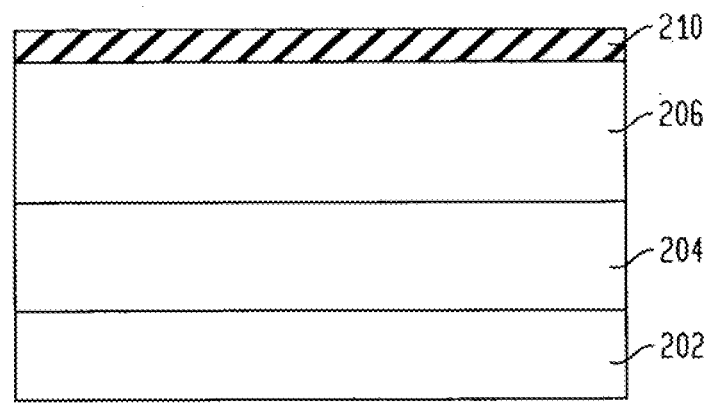
FIGS. 2a-2e illustrate an example of self-aligned implant and self-aligned etch steps carried out in fabricating the diode of FIG. 2.

FIGS. 2a-2e illustrate an example of process steps carried out to form the Schottky diode of FIG. 2. As FIG. 2a shows, a highly doped nitride-based semiconductor layer 204 is formed atop a substrate 202. Next, a lower doped nitride-based semiconductor layer 206 is formed atop the highly doped layer 204, and a first Schottky metal layer 210 is then formed atop the lower doped layer 206 in the manner described above regarding FIG. 1.

Figure 2B:
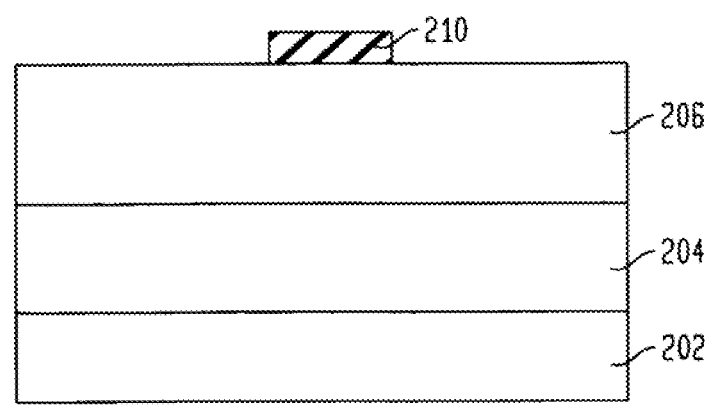
Figure 2C:
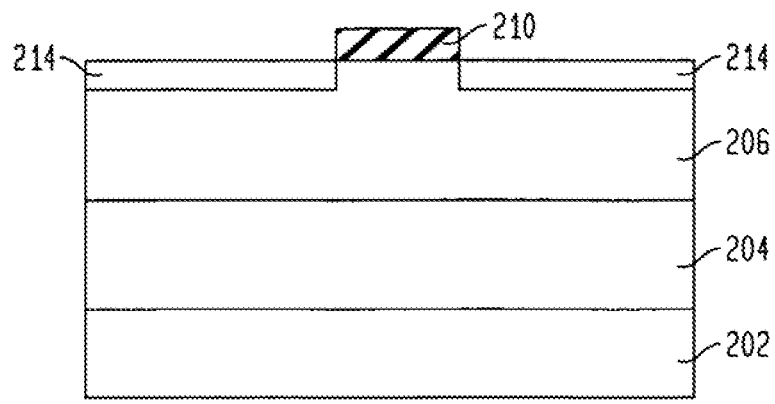

Then, as FIG. 2b shows, the first Schottky metal layer 210 is patterned and etched so that only a portion of the first metal layer remains atop the lower doped layer 206. The remaining portion of the first Schottky metal layer 210 is then used as a mask during an ion implant step to form implanted regions 214 in the lower doped layer 206, as FIG. 2c shows. Typically, one or more species such as cadmium (Cd), magnesium (Mg), zinc (Zn), iron (Fe), nickel (Ni), silicon (Si), aluminum (Al), boron (B), nitrogen (N), or oxygen (O) are implanted at this time.

Figure 2D:
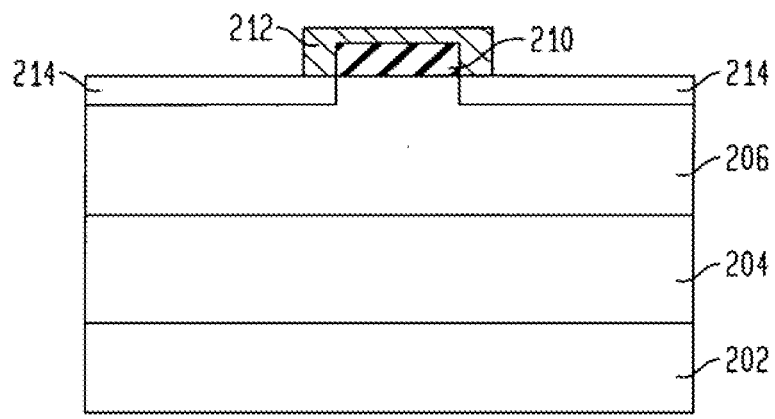
Figure 2E:
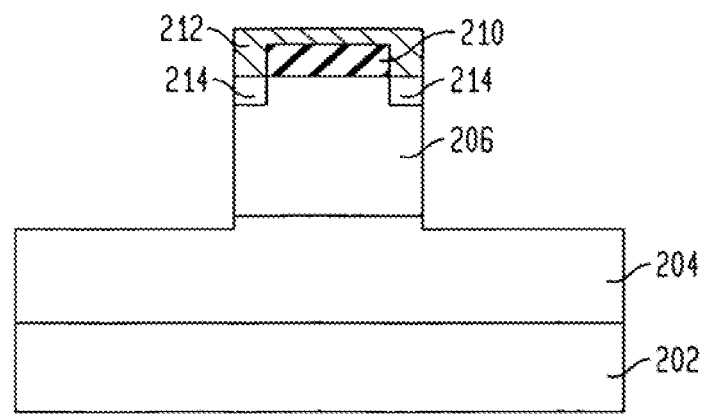

Then, a second Schottky metal layer 212 is formed atop of and surrounding the first Schottky metal layer 210, as shown in FIG. 2d. The second metal layer 212 may be formed by selective deposition or by a deposition step followed by patterning and etching of the metal layer. The second metal layer 212 is then used to mask an etch step that removes the exposed regions of the implanted layer 214 as well as both an underlying regions of the lightly doped layer 206 and a portion of an underlying region of the highly doped layer 204, as FIG. 2e shows. Thereafter, an ohmic metal contact layer 208 is formed in the manner described above to obtain the device shown in FIG. 2.

In this embodiment, the Schottky metal layers 210 and 212 cover the entire top surface of the mesa 206. To prevent possible arcing or shorting between the Schottky contact and the ohmic contact, the ohmic contact 208 is preferably substantially farther away from the mesa than is found in known devices to maintain a desired minimum distance between the Schottky and ohmic contacts.

Figure 3A:
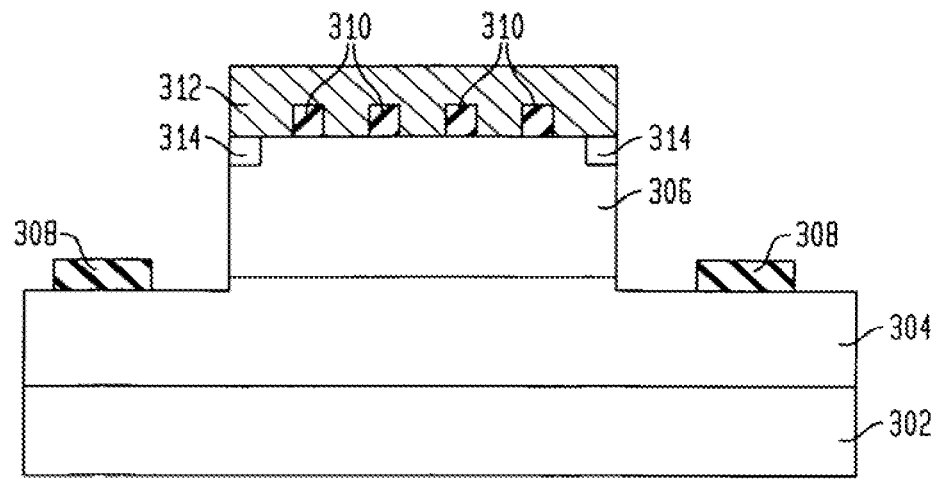
FIG. 3a shows a cross-sectional view of a Schottky diode having a dual metal Schottky contact according to a further embodiment of the invention.

FIG. 3a shows a Schottky diode 300 that uses the dual metal contact configuration according to a further embodiment of the invention. A highly doped nitride-based semiconductor layer 304 is formed atop a substrate 302 and a lower doped nitride-based semiconductor mesa 306 is formed atop the highly doped layer 304 in the manner described above. A first low work function Schottky contact metal layer 310 is then deposited selectively as very narrow stripes with small separations between the stripes. A second higher work function Schottky contact metal layer 312 is then deposited atop of and in the gaps between the first Schottky contact metal stripes 310.

Figure 3B:
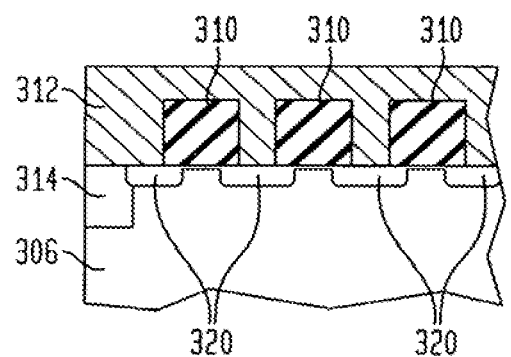
FIG. 3b is a cut-away view showing the Schottky contact of the diode of FIG. 3a and the depletion region when no bias voltage is applied.
Figure 3C:
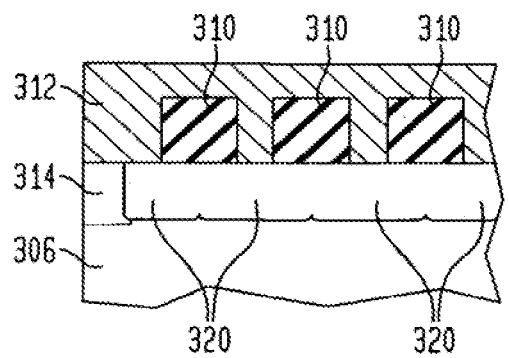
FIG. 3c is a cut-away view showing the Schottky contact of the diode of FIG. 3a and the depletion region when the device is reversed biased.

When no voltage is applied to the device, shallow depletion regions 320 are formed in the layer 306 under the second Schottky contact metal layer 312, as FIG. 3b shows. When the device is reverse biased, the diode's depletion regions 320 grow downward as well as expand underneath the first Schottky contact metal stripes 310 and then overlap to completely cut-off the lower work function first metal layer 310, as shown in FIG. 3c. Preferably, the spacing between the first Schottky contact metal stripes 310 should be sufficiently small so that the cut-off occurs. The cut-off of the first Schottky metal layer further reduces the diode's leakage current and also enhances the reverse blocking voltage $V_R$ while the forward voltage drop $V_F$ remains essentially unaffected. Based on capacitance vs. voltage measurements, the width of the first Schottky contact metal stripes 310 are preferably in the range of microns (1-5 μm) with a similarly sized spacing.

Alternatively, the first Schottky contact metal layer may be selectively deposited a small spot or dot-shaped regions, each having a width in the range of single microns and with sufficiently small separations between them.

Figure 4A:
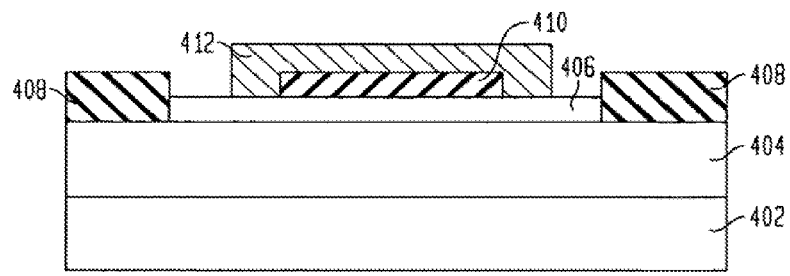
FIG. 4a shows a cross-sectional view of a field effect transistor (FET) having a dual metal Schottky contact according to a still further embodiment of the invention.

The dual metal Schottky contact of the invention is also applicable to a field effect transistor (FET) device shown in FIG. 4a. Here, a first nitride-based semiconductor layer 404, such as GaN, is formed atop a substrate 402. Another nitride-based semiconductor layer 406, such as AlGaN, forms a heterojunction with a region of the first nitride-based semiconductor layer 404. A lower work function first Schottky metal contact layer 410 covers part of the top surface of the layer 406, and a higher work function second Schottky metal contact layer 412 is disposed atop of and surrounding the first Schottky metal contact layer 410. An ohmic metal contact layer 408 is disposed atop the layer 404 and is separated from the first and second Schottky metal contact layers 410,412 by the layer 406.

Figure 4B:
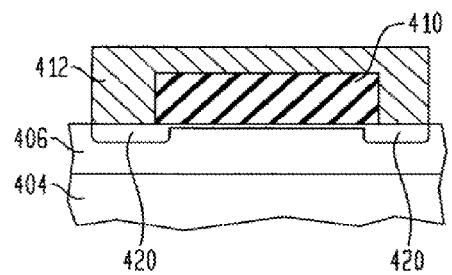
FIG. 4b is a cut-away view showing the Schottky contact region of the FET of FIG. 4a and the depletion region of the device with no bias voltage is applied.
Figure 4C:
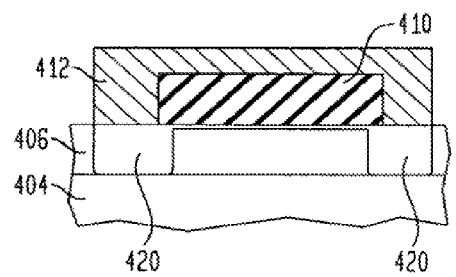
FIG. 4c is a cut-away view showing the Schottky contact of the FET of FIG. 4a and the depletion region when the device is reversed biased.

FIGS. 4b and 4c show a cut-away portion of the FET and illustrate the operation of the dual Schottky metal contact. When the Schottky diode of the FET is unbiased, shallow depletion regions 420 are formed within the layer 406 underneath the regions where the second Schottky contact metal contacts the layer 406, as shown in FIG. 4b. When the FET is operated such that the Schottky diode is reverse biased, the depletion regions 420 expand both downward into the layer 406 as well as underneath the first Schottky contact metal 410 in the manner described above, as FIG. 4c shows.

Figure 5:
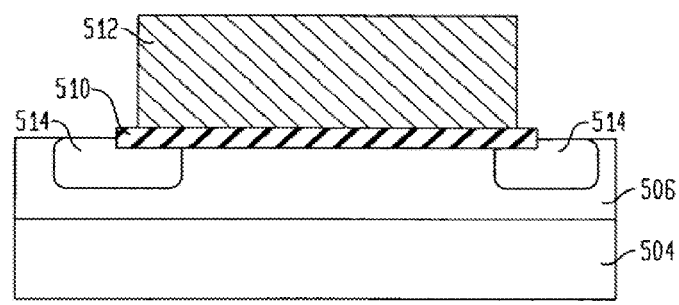
FIG. 5 shows a cross-sectional view of a Schottky diode having a dual metal Schottky contact according to a yet another embodiment of the invention.

In another embodiment of the invention, a dual arrangement of Schottky contact metals is used to improve metal adhesion, as shown in FIG. 5. A first Schottky contact metal layer 510 may be a high work function metal or a combination of such metals, such as Ni, Pd, TiW alloy, Ta, Ru, Re or Pt. Preferably, a Ni layer is used to provide better device performance. The second Schottky contact metal layer 512 may be formed of Ni, Pd, TiW, Pt, Al, Ti, Mo, Au or a combination of these metals. After the deposition of the first Schottky metal layer 510, the layer is annealed at a temperature that is lower than that required for formation of an ohmic contact but which is high enough to improve adhesion of the Schottky contact. Typically, the anneal temperature is in the range of 300 to 500° C. After the first Schottky contact metal is annealed, a second Schottky contact metal is deposited.

The two-metal structure and annealing process of FIG. 5 could also be used for other devices that have a GaN or an AlGaN top layer, such as for diodes or FETs.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A field-effect transistor (FET) comprising:
a substrate;
a first nitride-based semiconductor layer disposed atop the substrate, the first nitride-based semiconductor layer being of a first conductivity type and having a first doping concentration;
a second nitride-based semiconductor layer of the first conductivity type disposed atop a portion of the first nitride-based semiconductor layer, the second nitride-based semiconductor layer being a different nitride-based semiconductor layer than the first nitride-based semiconductor layer such that a heterojunction is formed between the first and second layers of nitride semiconductor;
a first Schottky contact metal layer having a first metal work function disposed on a top surface of the second nitride-based semiconductor layer, a first Schottky junction with a first barrier height being formed between the first Schottky contact metal layer and the second nitride-based semiconductor layer;
a second Schottky contact metal layer having a second metal work function disposed atop of and laterally surrounding the first Schottky contact metal layer, the second metal work function being higher than the first metal work function, a second Schottky junction with a second barrier height being formed between laterally surrounding portions of the second Schottky contact metal layer and the first nitride-based semiconductor layer; and
a metal layer disposed atop a planar surface of the first nitride-based semiconductor layer, an ohmic contact being formed between the metal layer and the first nitride-based semiconductor layer.

2. The FET of claim 1 wherein the first nitride-based semiconductor layer comprises gallium nitride.

3. The FET of claim 2 wherein the second nitride-based semiconductor layer comprises aluminum gallium nitride.

4. The FET of claim 1, wherein the first Schottky contact metal layer is selected from the group consisting of aluminum, titanium, molybdenum and gold.

5. The FET of claim 1, wherein the second Schottky contact metal layer is selected from the group consisting of nickel, palladium, a titanium-tungsten alloy, tantalum, rhenium, ruthenium and platinum.

6. The FET of claim 1 further comprising a buffer layer interposed between the substrate and the first nitride-based semiconductor layer.

* * * * *